(12) United States Patent
Pham-Van-Diep et al.

(10) Patent No.: US 6,260,741 B1
(45) Date of Patent: Jul. 17, 2001

(54) METHOD AND APPARATUS FOR FORMING DROPLETS

(75) Inventors: Gerald C. Pham-Van-Diep, Hopkinton, MA (US); Magdalena Andres, Narragansett, RI (US)

(73) Assignee: MPM Corporation, Franklin, MA (US)

( * ) Notice: Subject to any disclaimer, the term of this patent is extended or adjusted under 35 U.S.C. 154(b) by 0 days.

(21) Appl. No.: 09/253,631

(22) Filed: Feb. 19, 1999

(51) Int. Cl.$^7$ .................................................. B22D 41/00
(52) U.S. Cl. ............................. 222/590; 222/594; 75/331
(58) Field of Search ................................. 222/590, 593, 222/591, 594; 75/331; 266/202, 236, 239, 78; 347/11

(56) References Cited

U.S. PATENT DOCUMENTS

| | | | |
|---|---|---|---|
| 5,415,679 | * | 5/1995 | Wallace .................................. 222/590 |
| 5,643,353 | * | 7/1997 | Wallace et al. .......................... 75/331 |
| 6,029,896 | * | 2/2000 | Self et al. .................................. 239/4 |

* cited by examiner

Primary Examiner—Scott Kastler

(74) Attorney, Agent, or Firm—David E. Crosby; Mintz, Levin, Cohn, Ferris, Glovsky & Popeo, P.C

(57) ABSTRACT

An apparatus for dispensing a fluid includes a dispensing chamber coupled to a dispensing orifice and a fluid reservoir. The dispensing chamber is coupled to a transducer which is adapted to change the volume of the dispensing chamber in response to a signal applied to the transducer. The signal is characterized by 1) an initial rise time RT1 during which an increasing amplitude signal is applied to the transducer to gradually expand the dispensing chamber from a first volume at a first amplitude to a second volume at a second amplitude; 2) a fall time FT during which a decreasing amplitude signal is applied to the transducer to contract or compress the dispensing chamber rapidly (relative to the initial rise time RT1) to a third volume at third amplitude; 3) a final rise time RT2 during which an increasing amplitude signal is applied to the transducer to gradually expand the dispensing chamber to a fourth volume at a fourth amplitude. Preferably, the first volume is less than the second volume, the second volume is substantially greater than the third volume, the third volume is less than the fourth volume, and the first volume is same as the fourth volume and both are equal to the nominal volume of the dispensing chamber. In addition, the fall time is substantially smaller than both the initial rise time and the final rise time. In the preferred embodiment, the waveform amplitude is negatively offset by its center (or nominal) to peak amplitude.

11 Claims, 5 Drawing Sheets

METHOD AND APPARATUS FOR FORMING DROPLETS

CROSS-REFERENCE TO RELATED APPLICATIONS

Not Applicable

STATEMENT REGARDING FEDERALLY SPONSORED RESEARCH

Not Applicable

REFERENCE TO MICROFICHE APPENDIX

Not Applicable

BACKGROUND OF THE INVENTION

This invention relates to a method of and apparatus for dispensing fluids and, more particularly, to a method of and apparatus for producing droplets on demand.

Methods of forming and dispensing of droplets of liquids have been used in many applications including ink-jet printing and the precision dispensing of chemicals and pharmaceuticals. More recently, the basic technology has been utilized to provide accurate placement of solder on printed circuit boards (PCBs) and electronic components. For example, U.S. Pat. No. 5,415,679 to Wallace, describes an ejection device which includes an electrostrictive transducer which, when activated by a particular waveform, can be used to produce and apply droplets of solder to a substrate. The particular waveform described by Wallace is shown in FIG. 1. This waveform is characterized by a first rise time RT1, followed by a first dwell time DT1, followed by a fall time FT, followed by a second dwell time DT2 and a final rise time RT2 back to the nominal position.

The process by which a droplet is generated when the prior art waveform drives the transducer is well known. An expansion wave is generated during the first rise time RT1 and this wave splits into two waves which travel in opposite directions back and forth along the axis of the ejector. Each time a wave hits a tube end, a pressure inversion occurs (i.e. an expansion becomes a compression, and vise versa). A stable droplet is generated only if the compression wave generated during the fall time FT is synchronized with the passage of a compression wave traveling towards the orifice. This implies that the first dwell time DT1 of the waveform shown in FIG. 1 is critical to the formation of a droplet. Similarly, the expansion wave generated during the final rise time RT2 has to be synchronized by tuning the second dwell time DT2. In principle, the purpose for this expansion is to minimize or even cancel any residual pressure waves in the tube after a droplet is generated.

Developing practical droplet forming systems using the waveform shown in FIG. 1 has been difficult because determining the right dwell times DT1 and DT2 is difficult and typically requires continuous tuning which involves significant intervention of a trained operator. In addition, the jetting parameters necessary to achieve a stable system, Pressure, DT1, DT2, and Voltage, can vary from device to device making automatic tuning difficult.

Accordingly, it is an object of this invention to provide an improved method of and apparatus for producing droplets.

It is another object of this invention to provide an improved method of and apparatus for producing droplets which utilize a simplified waveform.

SUMMARY OF THE INVENTION

The present invention is directed to an apparatus for dispensing a fluid in droplets. The dispensing apparatus includes a dispensing chamber having a nominal volume for holding a volume of the fluid, a dispensing orifice coupled to the chamber to permit the fluid to be ejected from the chamber, a transducer coupled to the chamber and adapted for changing the volume of the chamber. A controller is connected to the transducer and is adapted for transmitting a signal to the transducer to selectively change the volume of the chamber. The signal generated by the controller and transmitted to the transducer includes three components: 1) an initial rise time during which the signal controls the transducer to gradually increase the volume of the chamber; 2) a fall time during which the signal controls the transducer to decrease the volume of the chamber; and 3) a final rise time during which the signal controls the transducer to gradually increase the volume of the chamber. In accordance with the present invention, the fall time is substantially smaller than the initial rise time and the final rise time. The voltage signal applied to the transducer gradually increases from a first voltage during the initial rise time to a second voltage, decreases during the fall time to a third voltage, and gradually increases from a third voltage during the initial rise time to a fourth voltage. The first voltage can be the same as the fourth voltage which is the nominal voltage of the signal.

The present invention also includes a method of producing a droplet in a dispensing apparatus which includes a dispensing chamber with an adjustable volume and a substantially constant pressure. The method includes the steps of: 1) gradually increasing the volume in the dispensing chamber over a first period of time, RT1; 2) decreasing the volume in the chamber over a second period of time, FT; and 3) gradually increasing the volume in the dispensing chamber over a third period of time, RT2; wherein said second period of time, FT is substantially smaller than the first period of time, RT1 and the third period of time, RT2.

The present invention further includes a method of producing a droplet in a dispensing apparatus which includes a dispensing chamber with substantially constant volume and an adjustable pressure. The method includes the steps of: 1) applying a substantially constant, decreased pressure to the dispensing chamber for a first period of time, RT1; 2) applying a substantially constant, increased pressure to the chamber for a second period of time, FT; and 3) applying a substantially constant, decreased pressure to the dispensing chamber for a third period of time, RT2; wherein the second period of time, FT is substantially smaller than the first period of time, RT1 and said third period of time, RT2.

The transducer can include a piezoelectric transducer that is bonded to the dispensing chamber or is integral with and forms a portion of the dispensing chamber. The piezoelectric transducer receives a voltage modulated signal that causes the transducer to change shape and causes the volume of the dispensing chamber to increase or decrease as a function of the voltage amplitude. The initial rise time, RT1 and final rise time, RT2 can each be on the order of 500 to 2000 microseconds and the fall time, FT can be on the order of approximately 0 microseconds.

BRIEF DESCRIPTION OF THE DRAWINGS

The foregoing and other objects of this invention, the various features thereof, as well as the invention itself, may be more fully understood from the following description, when read together with the accompanying drawings in which.

DETAILED DESCRIPTION OF THE PREFERRED EMBODIMENTS

The present invention is directed to a method of and apparatus for generating droplets. As a person having ordinary skill will appreciate, the present invention can be used with many applications including ink-jet printing and the precision dispensing of chemicals and pharmaceuticals. By way of example, the present invention is described below in connection with a system for precisely depositing droplets of solder for use in the manufacture of electronic devices.

Soldering is used extensively in the manufacture of electronic devices to mechanically and/or electrically connect components together. With the trend in electronics packaging toward increased miniaturization, the size of the devices is decreasing where as the number of leads or connections is increasing. As a result, the size and spacing of the leads must be reduced requiring more precise positioning and interconnection technologies.

As is known, electronic components can be mechanically and electrically connected by depositing droplets of solder on circuit boards, electronic components, semiconductor devices and the like. This technology includes a system which uses a solder dispensing applicator adapted for accurately producing droplets of solder and precisely depositing the droplets on predefined locations of an electronic component. Typically, such a system includes a stationary solder dispensing applicator and a positioning or indexing fixture adapted to move the electronic component under the applicator to precisely deposit a predefined quantity of solder on a predefined location of the electronic component. Alternatively, the component can be held stationary and the applicator can be moved relative to the electronic component. Such a system is disclosed in U.S. Pat. No. 5,415,679 to Wallace which is hereby incorporated by reference.

Figure 2:
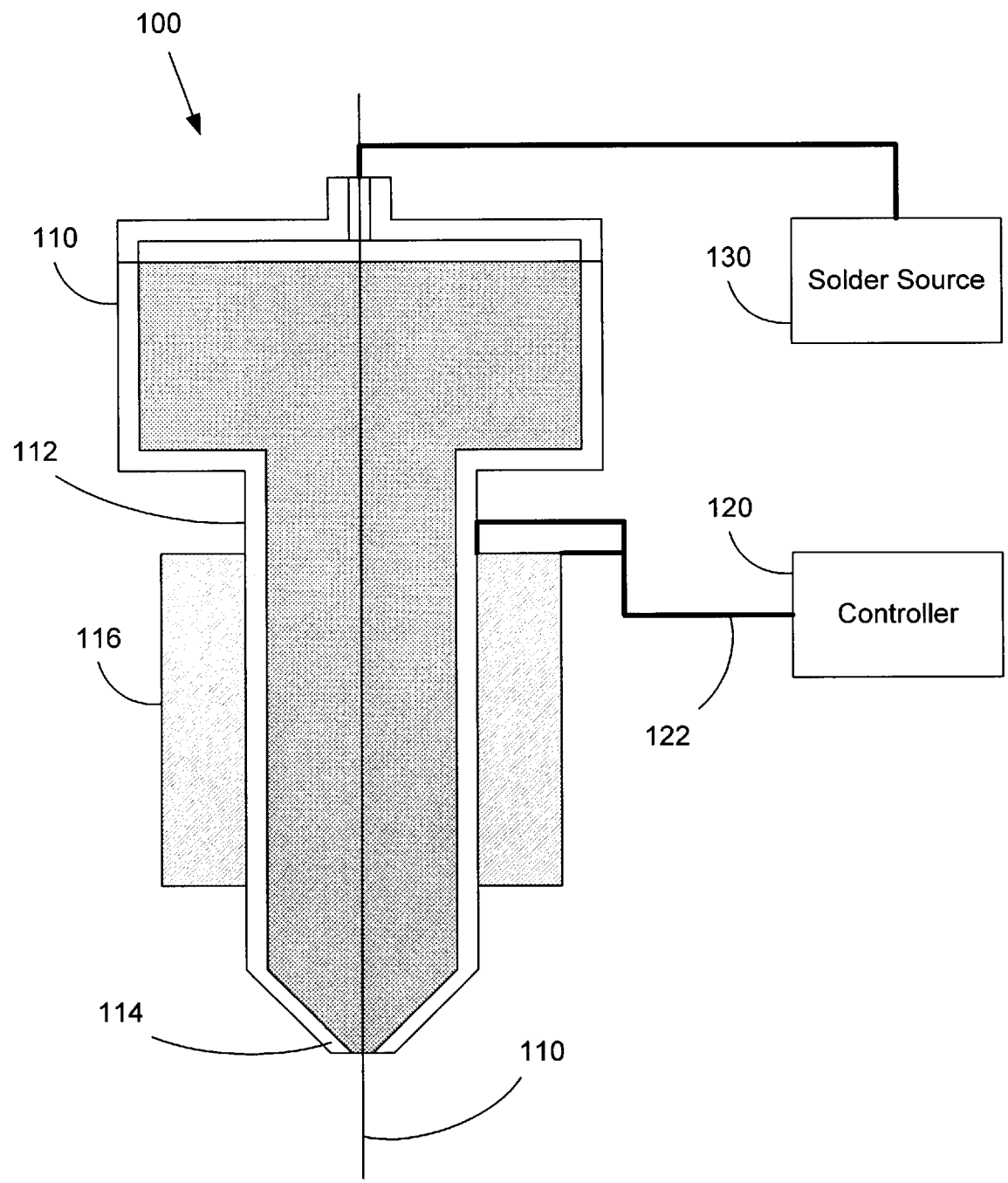
FIG. 2 shows a diagrammatic view of an apparatus for producing droplets in accordance with the present invention.

FIG. 2 shows a dispensing device 100 in accordance with the present invention. The dispensing device 100 includes a reservoir 110, adapted for holding the fluid to be dispensed, coupled to one end of a dispensing chamber 112 and a dispensing orifice 114 coupled to the other end of the dispensing chamber 112. In the illustrative embodiment, the reservoir 110 can include a heating element (not shown) to maintain the solder in a liquid or molten state to enable the solder to be dispensed as a fluid. The dispensing device 100 further includes a transducer 116 disposed about the dispensing chamber 112 which is adapted for expanding and contracting the dispensing chamber 112 radially with respect to the longitudinal axis 118 of the dispensing chamber 112. A controller 120 is coupled to the transducer 116 and is adapted to actuate the transducer to expand and contract the dispensing chamber 112 according to a predefined time sequence. The dispensing device 100 can also include a source or supply system that can supply the fluid (in the illustrative example, molten solder) to the reservoir 110.

Figure 3:
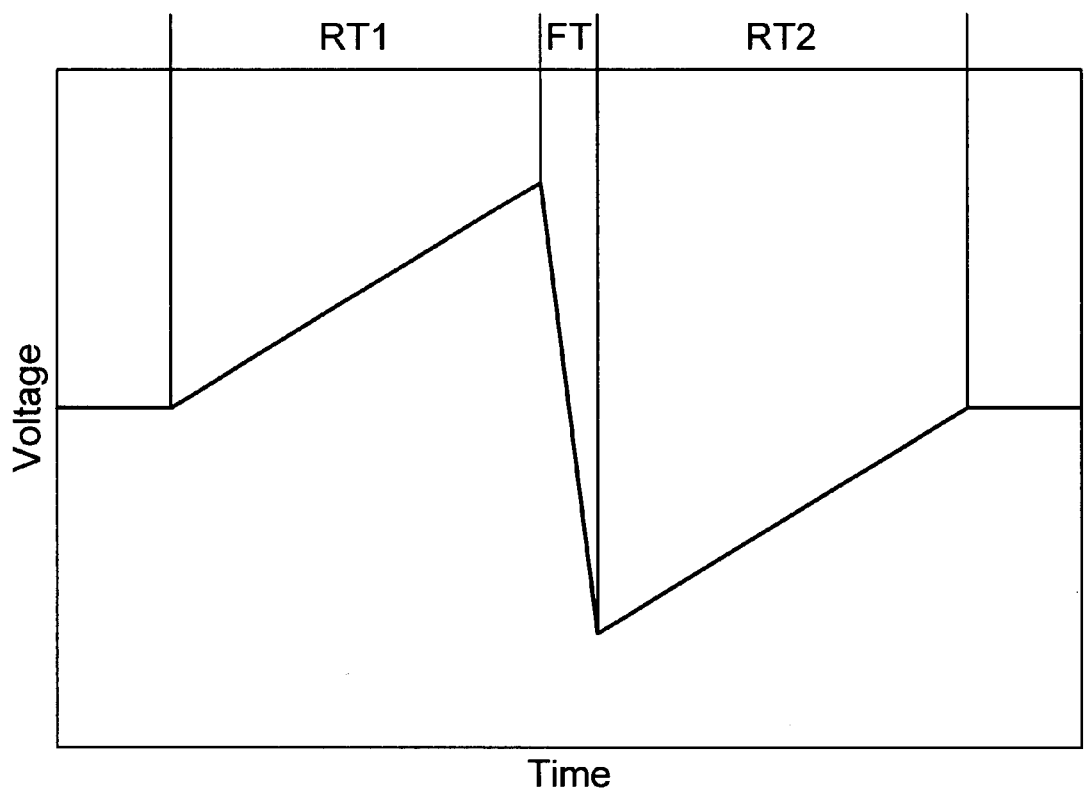
FIG. 3 shows a diagrammatic view of an electronic waveform for producing a droplet in accordance with the present invention.

In one embodiment, the dispensing chamber 112 is a glass capillary tube approximately 0.675 in long and having an inside diameter of approximately 0.018 in and an outside diameter of approximately 0.028 in. The transducer 116 is a piezoelectric transducer that is bonded, preferably by a high temperature epoxy, to the outside surface of the capillary tube 112 and extends approximately 0.5 in along the length of the capillary tube 112 or co-extends over approximately 74 percent of the length of the capillary tube 112. Preferably, orifice 114 is cone shaped and has a diameter of approximately 80 microns, preferably approximately 60 microns. Preferably, the piezoelectric transducer 116 forms an annulus around the capillary tube 112 having an inside diameter of approximately 0.030 inches and an outside diameter of approximately 0.050 inches and the controller 120 includes leads 122 which are coupled to the inside and outside surfaces of the annular piezoelectric transducer 116. The controller 120 is adapted for applying a signal to the transducer 116 causing the transducer 116 and the capillary tube 112 to expand and contract according to a timed sequence or profile such as that shown in FIG. 3. FIG. 3 shows the waveform for the voltage signal to be applied to the transducer 116 in accordance with the preferred embodiment of the invention. This waveform is composed of three distinct parts: 1) an initial rise time RT1 during which an increasing amplitude signal is applied to the transducer 116 to gradually expand the dispensing chamber 112 from a first volume at a first amplitude to a second volume at a second amplitude; 2) a fall time FT during which a decreasing amplitude signal is applied to the transducer 116 to compress or contract the dispensing chamber 112 rapidly (relative to the initial rise time RT1) to a third volume at third amplitude; and 3) a final rise time RT2 during which an increasing amplitude signal is applied to the transducer 116 to gradually expand the dispensing chamber 112 to a fourth volume at a fourth amplitude. Preferably, the first volume is less than the second volume, the second volume is substantially greater than the third volume, the third volume is less than the fourth volume, and the first volume is same as the fourth volume (and both are equal to the nominal volume of the dispensing chamber). Preferably, the fall time is substantially smaller than both the initial rise time and the final rise time. In the preferred embodiment, the waveform amplitude is negatively offset by its center (or nominal) to peak amplitude.

In the preferred embodiment, the initial rise time RT1 is in the range of 500 to 2000 microseconds, the final rise time RT2 is in the range of 500 to 2000 microseconds, and the fall time is in the range of approximately 0 to 200 microseconds. Preferably, the difference between the second amplitude and the first amplitude can be in the range from approximately 5 to approximately 175 volts, the difference between the second amplitude and the third amplitude can be in the range from approximately 10 to approximately 350 volts and the fourth amplitude is approximately equal to the first amplitude (which is the nominal voltage of the signal). In the preferred embodiment, the first voltage or the nominal voltage is negatively offset from zero by an amount equal to the difference between the peak and nominal voltages (5 to 175 volts).

Figure 1:
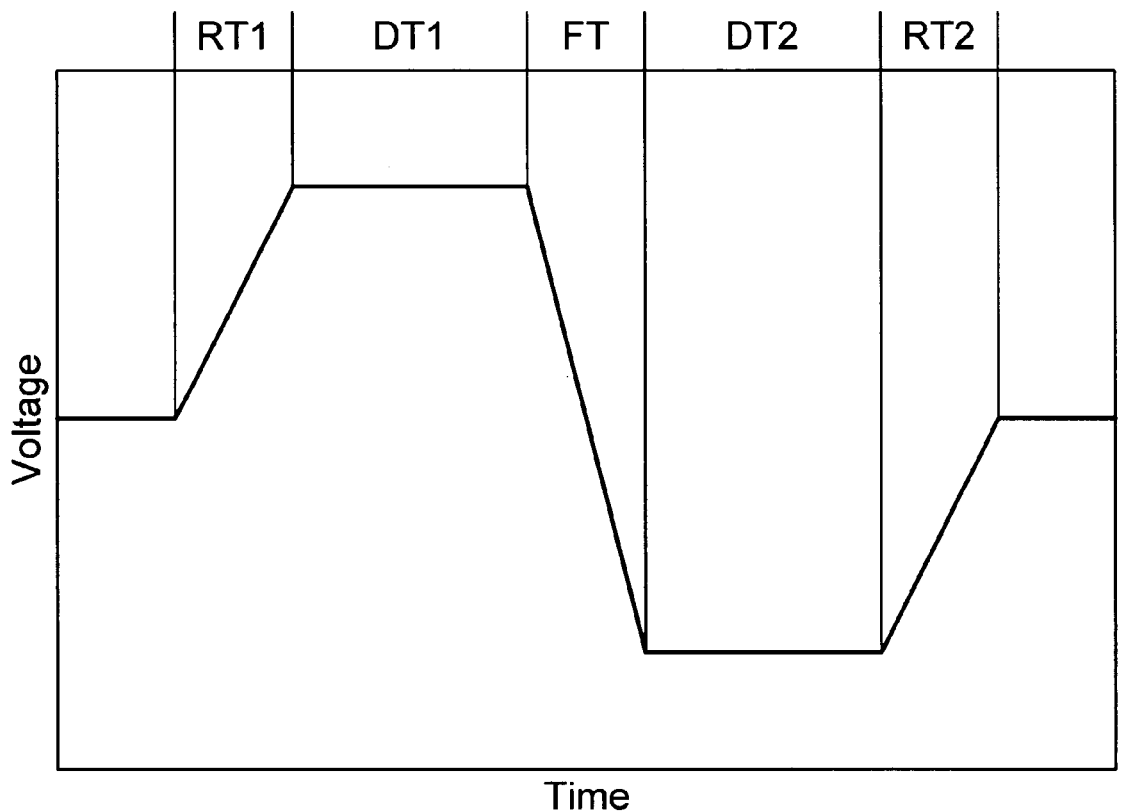
FIG. 1 shows a prior art waveform used to produce a droplet.

As one of ordinary skill in the art will appreciate, the waveform of the present invention does not include dwell times DT1 and DT2 as is known the prior art and thus functions in a different manner to produce a droplet. The waveform of FIG. 3 relies on an acoustic mechanism that is very different than the one used by the prior art waveform shown in FIG. 1. The prior art waveform relies on the synchronization between pressure waves reflecting within the capillary tube and a compression of the transducer 116 to create a droplet. The method for forming a droplet in accordance with the present invention includes in an initial step, gently preloading (expanding) the dispensing chamber 112, subsequently producing a droplet or ball of fluid by rapidly compressing the dispensing chamber 112, and finally, gently expanding the dispensing chamber 112, preferably, back to a nominal state. Because the first and final stages of the ball generating sequence are very slow, perturbations of the fluid within the dispensing chamber 112 are kept to a minimum and consequently do not interfere with the ball generation process.

During the fall time FT, a finite volume of fluid is expelled from the dispensing orifice 114 of the dispensing device 100 and creates a droplet. By tuning waveform parameters, the waveform amplitude and the fall time FT, the drop formation process including the speed and size of the droplet can be controlled. For example, increasing the fall time FT increases the droplet diameter, however an increase in fall time FT should, preferably be accompanied by an increase in the waveform amplitude to compensate for any loss in drop velocity or stability. Accordingly, decreasing the fall time FT decreases the drop size and should, preferably be accompanied by a decrease in waveform amplitude to account for an increase of drop velocity or a loss of stability.

In the illustrative example, dispensing device 100 according to the present invention uses molten eutectic Tin/Lead (63/37) solder as the working fluid and dispenses droplets of molten solder. For a dispensing device with a typical dispensing orifice 114 diameter of 60 +/−2 micrometers, droplet sizes in the range from 40 micrometers to 100 micrometers can be produced in a consistent manner. As one having ordinary skill in the art will appreciate, the method in accordance with the present invention can be used to dispense other molten alloys or room temperature fluids with minor changes to account for changes in basics fluid properties such as surface tension, viscosity and wetting angle between the fluid and the dispensing device 100.

In accordance with the invention, the range of droplet sizes can vary and is a function of the coupling efficiency between the transducer 116 and dispensing chamber 112. Thus, where the walls of the dispensing chamber 112 are flexible and responsive to movements initiated by the transducer 116, a wider range of droplet sizes and more stable operation over that range can be expected. Thus, in an alternative embodiment, the transducer 116 may be combined integrally with the reservoir 110 and the dispensing orifice 114 to form the dispensing chamber 112. In this way, any undesirable effects of the mechanical interaction between the walls of the dispensing chamber 112 and the transducer 116 can be reduced because the transducer 116 forms a portion of the walls of the dispensing chamber 112.

Figure 4:
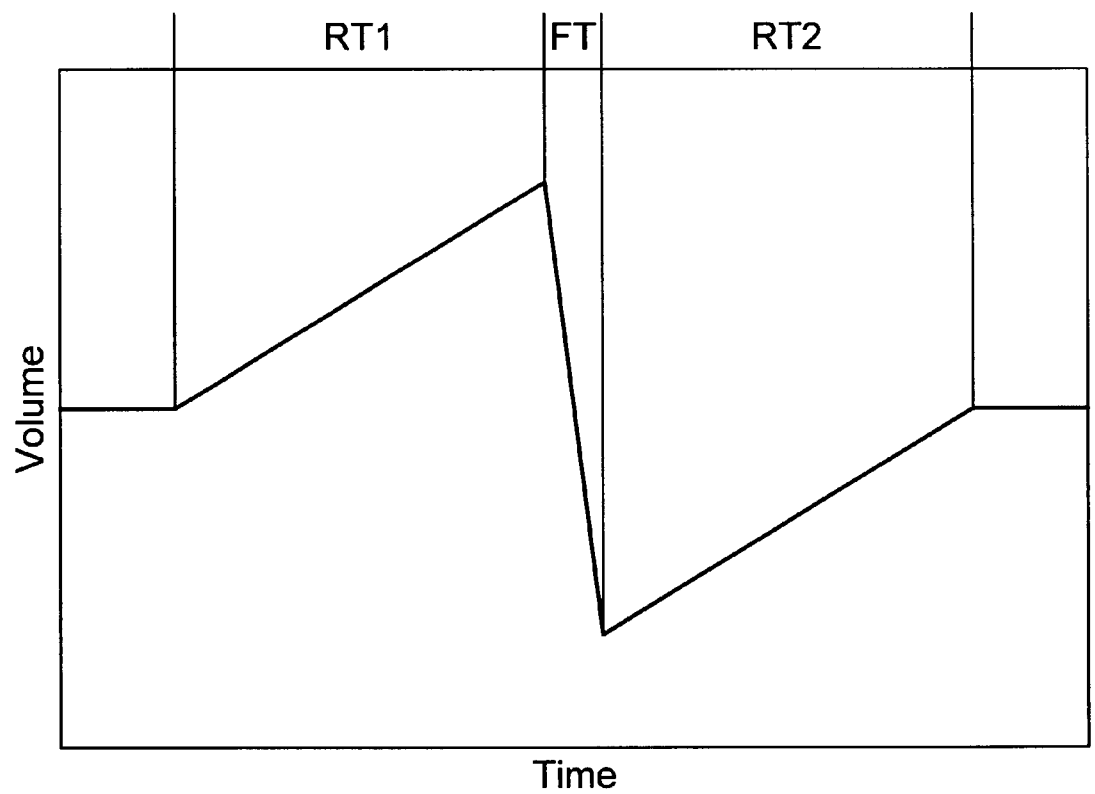
FIG. 4 shows a diagrammatic view of a volume waveform for producing a droplet in accordance with the present invention.

FIG. 4 shows the volume profile in the form of a waveform to be applied to the dispensing chamber 112 in accordance with one embodiment of the invention. As one of ordinary skill in the art will appreciate, the transducer 116 of the embodiment described above can be replaced by a mechanical or electro-mechanical system which can change the volume in the dispensing chamber 112 in order to change the volume according to the waveform as shown in FIG. 4. In a manner similar to FIG. 3, this waveform is composed of three distinct parts: 1) an initial rise time RT1 during which the volume of the dispensing chamber 112 to gradually increased from a first volume to a second volume; 2) a fall time FT during which the volume of the dispensing chamber 112 is decreased to a third volume; and 3) a final rise time RT2 during which the volume of the dispensing chamber 112 is gradually increased to a fourth volume. Preferably, the first volume is less than the second volume, the second volume is substantially greater than the third volume, the third volume is less than the fourth volume, and the first volume is same as the fourth volume and both are equal to the nominal volume of the dispensing chamber. In addition, the fall time, FT can be substantially smaller than the initial rise time, RT1 and the final rise time, RT2.

Figure 5:
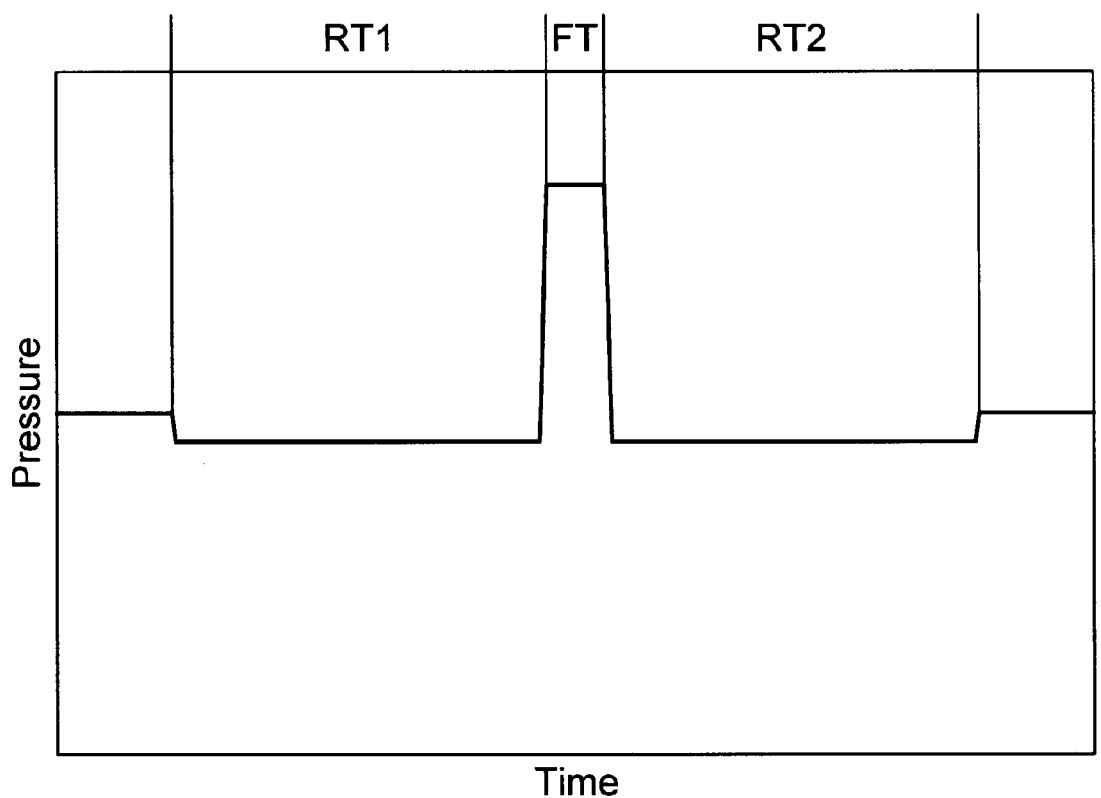
FIG. 5 shows a diagrammatic view of a pressure profile for producing a droplet in accordance with the present invention.

FIG. 5 shows a pressure waveform according to an alternative embodiment of the present invention. As one of ordinary skill in the art will appreciate, the transducer 116 of the embodiment described above can be replaced by a mechanical or electro-mechanical system (such as an actuated pump, piston or diaphragm) which can dynamically change the pressure in the dispensing chamber 112 in order to produce a dynamic pressure change according to the waveform as shown in FIG. 5. In a manner similar to FIGS. 3, the pressure waveform is composed of three distinct parts: 1) an initial rise time RT1 during which a substantially constant, decreased P1 pressure is applied to dispensing chamber 112; 2) a fall time FT during which a substantially constant, increased pressure P2 is applied to the dispensing chamber 112; and 3) a final rise time RT2 during which a substantially constant, decreased pressure P3 is applied to the dispensing chamber 112. Preferably, the first pressure P1 is less than the initial or nominal pressure, the second pressure P2 is greater than the first pressure P1, and the third pressure P3 is substantially the same as the first pressure P1 and both are less than the initial pressure of the dispensing chamber. In addition, the fall time, FT can be substantially smaller than the initial rise time, RT1 and the final rise time, RT2.

The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A method of dispensing a fluid stored at a nominal pressure in a dispensing chamber having a dispensing orifice, said method comprising the steps of:

applying a decreased pressure to said dispensing chamber over a first period of time, RT1;

applying an increased pressure to said chamber over a second period of time, FT;

applying a decreased pressure to said dispensing chamber over a third period of time, RT2;

wherein said second period of time, FT is substantially smaller than said first period of time, RT1 and said third period of time, RT2 and wherein there is substantially no dwell time between said RT1 and said FT and between said FT and said RT2.

2. A method of dispensing a fluid stored in a dispensing chamber having a nominal volume and having a dispensing orifice, said method comprising the steps of:

gradually increasing the volume of said dispensing chamber over a first period of time, RT1;

decreasing the volume of said chamber over a second period of time, FT;

gradually increasing the volume of said dispensing chamber over a third period of time, RT2;

wherein said second period of time, FT is substantially smaller than said first period of time, RT1 and said third period of time, RT2 and wherein there is substantially no dwell time between said RT1 and said FT and between said FT and said RT2.

3. A method of dispensing a fluid according to claim 1 wherein said first period of time, RT1 varies in a range from approximately 500 microseconds to 2000 microseconds and said third period of time, RT2 varies in a range from approximately 500 microseconds to 2000 microseconds.

4. A method of dispensing a fluid according to claim 3 wherein said first period of time, RT1 is approximately 1000 microseconds and said third period of time, RT2 is approximately 1000 microseconds.

5. A method of dispensing a fluid according to claim 1 wherein said second period of time, FT varies in a range from approximately 0 microseconds to 200 microseconds.

6. A method of dispensing a fluid according to claim 5 wherein said second period of time is approximately 60 microseconds.

7. A method of dispensing a fluid according to claim 1 wherein said chamber is rigid and maintains a substantially constant volume throughout all of said method steps.

8. A method of dispensing a fluid according to claim 2 wherein said first period of time, RT1 varies in a range from approximately 500 microseconds to 2000 microseconds and said third period of time, RT2 varies in a range from approximately 500 microseconds to 2000 microseconds.

9. A method of dispensing a fluid according to claim 8 wherein said first period of time, RT1 is approximately 1000 microseconds and said third period of time, RT2 is approximately 1000 microseconds.

10. A method of dispensing a fluid according to claim 2 wherein said second period of time, FT varies in a range from approximately 10 microseconds to 200 microseconds.

11. A method of dispensing a fluid according to claim 10 wherein said second period of time is approximately 100 microseconds.

* * * * *